US009905485B2

(12) United States Patent
Kondo

(10) Patent No.: US 9,905,485 B2
(45) Date of Patent: Feb. 27, 2018

(54) METHOD OF MONITORING OUTPUT INTENSITY OF LASER BEAM IN BEVEL ETCHING APPARATUS

(71) Applicant: Tokyo Electron Limited, Tokyo (JP)

(72) Inventor: Masaki Kondo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 125 days.

(21) Appl. No.: 14/956,542

(22) Filed: Dec. 2, 2015

(65) Prior Publication Data

US 2016/0172257 A1 Jun. 16, 2016

(30) Foreign Application Priority Data

Dec. 12, 2014 (JP) .................. 2014-241613

(51) Int. Cl.
| | |
|---|---|
| *G01R 31/00* | (2006.01) |
| *H01L 21/66* | (2006.01) |
| *B23K 26/362* | (2014.01) |
| *B23K 26/03* | (2006.01) |
| *H01L 21/02* | (2006.01) |
| *H01L 21/311* | (2006.01) |
| *H01L 21/67* | (2006.01) |
| *B23K 26/361* | (2014.01) |

(52) U.S. Cl.
CPC ............ *H01L 22/26* (2013.01); *B23K 26/032* (2013.01); *B23K 26/361* (2015.10); *B23K 26/362* (2013.01); *H01L 21/0209* (2013.01); *H01L 21/31138* (2013.01); *H01L 21/6708* (2013.01); *H01L 21/67115* (2013.01); *H01L 21/67253* (2013.01); *H01L 22/12* (2013.01)

(58) Field of Classification Search
CPC ... H01L 22/26; H01L 21/0209; H01L 21/681; H01L 21/31138; B23K 26/0823; B23K 26/14; B23K 26/032; B23K 26/362
USPC ........................................ 216/59, 60, 61, 65
See application file for complete search history.

(56) References Cited

U.S. PATENT DOCUMENTS

| | | | |
|---|---|---|---|
| 2009/0143894 A1* | 6/2009 | Sakuragi ............... | B24B 37/345 700/121 |
| 2009/0184234 A1* | 7/2009 | Shindo ................. | B23K 26/046 250/206 |

(Continued)

FOREIGN PATENT DOCUMENTS

JP     2010-141237     6/2010

Primary Examiner — Binh X Tran
(74) Attorney, Agent, or Firm — IPUSA, PLLC

(57) ABSTRACT

Disclosed is an etching processing method using a bevel etching apparatus for etching a substrate by irradiating a laser beam, the bevel etching apparatus including a laser generator and an image capturing unit. The method includes a process, by the image capturing unit, of capturing an image of an inner part of a processing container by illuminating the inner part of the processing container by scattered light of the laser beam emitted from the laser generator; a process of calculating brightness of an image of a predetermined area out of the captured image of the inner part of the processing container; and a process of monitoring, based on data indicating a correlation between an output value of the laser beam output from the laser generator and the brightness, the output value of the laser beam with respect to the calculated brightness.

8 Claims, 8 Drawing Sheets

(56) References Cited

U.S. PATENT DOCUMENTS

| | | | |
|---|---|---|---|
| 2010/0147327 A1* | 6/2010 | Kondo | B08B 7/0042 134/1 |
| 2011/0041874 A1* | 2/2011 | Shindou | H01L 21/0209 134/1.3 |
| 2015/0043803 A1* | 2/2015 | Jeong | G06T 7/001 382/149 |

* cited by examiner

METHOD OF MONITORING OUTPUT INTENSITY OF LASER BEAM IN BEVEL ETCHING APPARATUS

CROSS-REFERENCE TO RELATED APPLICATION

The present application is based upon and claims the benefit of priority of Japanese Patent Application No. 2014-251613, filed on Dec. 12, 2014, the entire contents of which are incorporated herein by reference.

BACKGROUND OF THE INVENTION

1. Field of the Invention

The present invention relates to an etching processing method and a bevel etching apparatus.

2. Description of the Related Art

A bevel/backside polymer that is adhered to a bevel part (a chamfered part of an edge portion of a wafer) of a semiconductor wafer (which may also be referred to simply as "wafer," hereinafter) may contaminate a surface of a device, or may adversely affect a yield rate of production of a device.

Thus, a device has been proposed that can apply an etching process so as to remove a bevel/backside polymer by irradiating a laser beam onto a bevel part of a wafer (cf. Patent Document 1 (Japanese Unexamined Patent Publication No. 2010-141237), for example). Output intensity of a laser beam that is irradiated onto a bevel part can be controlled by monitoring and adjusting an electric current that is supplied to a laser generator.

However, even if an electric current that is to be supplied to a laser generator is the same, due to a failure or aged deterioration of a laser generator, output intensity of a laser beam may be varied. Thus, even if an electronic current that is supplied to a laser generator is monitored during operation of a device, it may be difficult to detect an abnormal state for a case in which the electric current that is supplied to the laser generator is not varied and an abnormal value is output as an output value of a laser beam. Consequently, a laser beam with power that is greater than a specified value may be irradiated onto a bevel part of a wafer, and the bevel part may be removed, or a defect may occur in the bevel part.

There is a need for detecting abnormality in an output value of a laser beam during an etching process of a bevel part.

SUMMARY OF THE INVENTION

According to an aspect of the present invention, there is provided an etching processing method using a bevel etching apparatus configured to etch a substrate by irradiating a laser beam, the bevel etching apparatus including a laser generator and an image capturing unit. The method includes a process, by the image capturing unit, of capturing an image of an inner part of a processing container by illuminating the inner part of the processing container by scattered light of the laser beam that is emitted from the laser generator; a process of calculating brightness of an image of a predetermined area out of the captured image of the inner part of the processing container, the predetermined area being selected in advance; and a process of monitoring, based on data indicating a correlation between an output value of the laser beam output from the laser generator and the brightness, the output value of the laser beam with respect to the calculated brightness.

According to another aspect of the present invention, there is provided a bevel etching apparatus configured to etch a substrate by irradiating a laser beam. The bevel etching apparatus includes a laser generator; an image capturing unit; and a controller. The image capturing unit is configured to illuminate an inner part of a processing container by scattered light of the laser beam that is emitted from the laser generator, and the image capturing unit is configured to obtain an image of the inner part of the processing container. The controller is configured to calculate brightness of an image of a predetermined area out of the captured image of the inner part of the processing container, the predetermined area being selected in advance, and the controller is configured to monitor, based on data indicating a correlation between an output value of the laser beam output from the laser generator and the brightness, the output value of the laser beam with respect to the calculated brightness.

According to an embodiment of the present invention, abnormality in an output value of a laser beam can be detected during an etching process of a bevel part.

Other objects, features and advantages of the present invention will become more apparent from the following detailed description when read in conjunction with the accompanying drawings.

DESCRIPTION OF THE PREFERRED EMBODIMENTS

Figure 1:
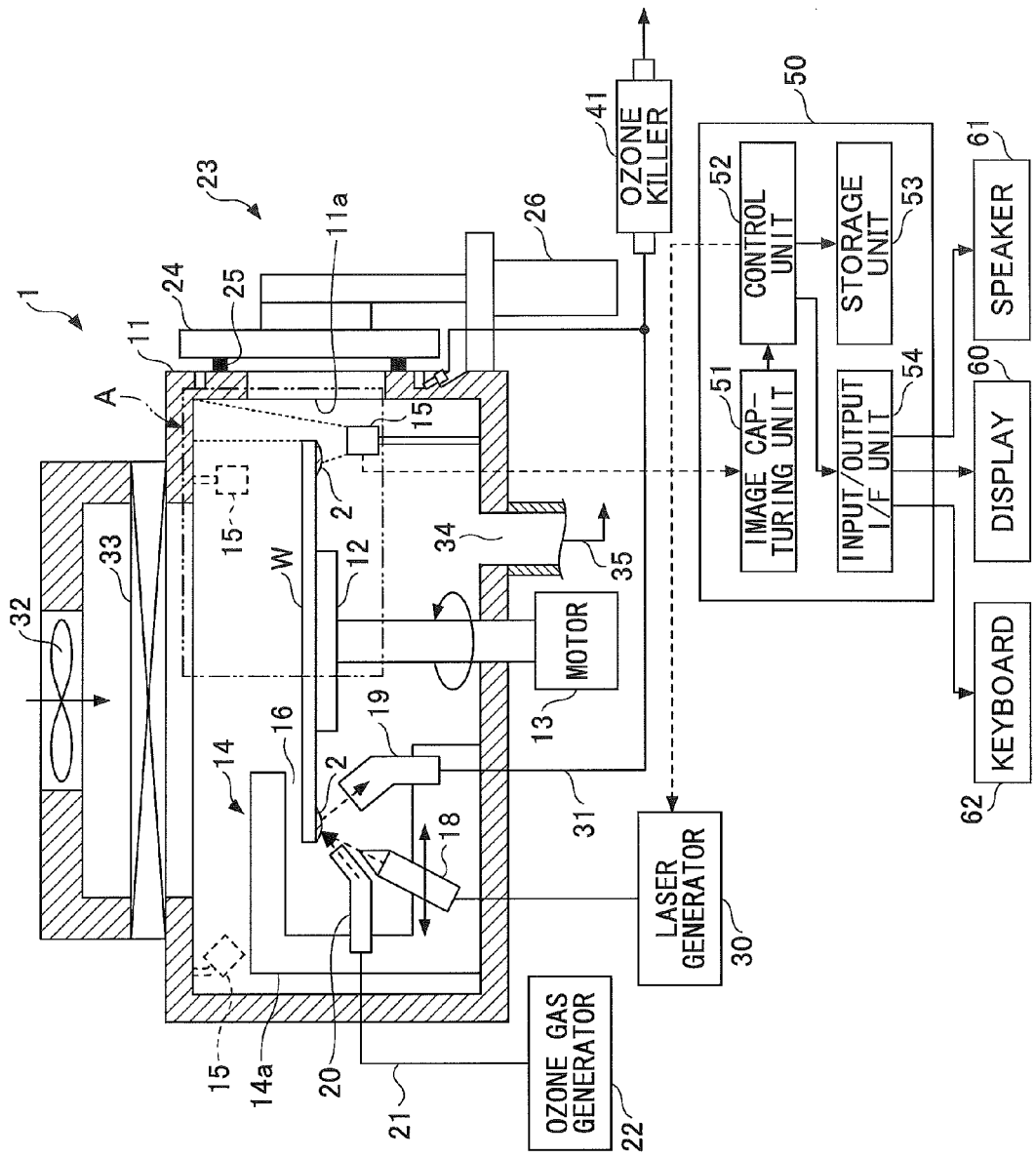
FIG. 1 is a diagram showing an example of a bevel etching apparatus according to an embodiment.

Embodiments of the present invention are described below by referring to the accompanying drawings. Note that, in the specification and the drawings, similar reference numerals may be attached to substantially the same configurations, and thereby duplicate explanations may be omitted.

(Introduction)

During production of a semiconductor integrated circuit, upon applying a plasma etching process to a wafer, radicals and ions that are generated in plasma can reach a bevel surface and a rear surface, and some polymers may be adhered to the bevel surface and the rear surface. The adhered foreign material may be referred to as a bevel/backside polymer (which may be referred to as "BSP," hereinafter). It may be desirable to remove the BSP because the BSP may contaminate a surface of a semiconductor integrated circuit device, and the BSP may adversely affect a yield rate of a product. Thus, a bevel etching apparatus can be designed to remove the BSP by applying a heating process in which a laser beam and ozone gas can be used. In the following descriptions, after describing an example of a configuration of a bevel etching apparatus according to the embodiment, a method of monitoring an output value of a laser generator that can be used in the bevel etching apparatus is described.

[Overall Configuration of the Bevel Etching Apparatus]

An example of a bevel etching apparatus 1 according to the embodiment is described by referring to FIG. 1. The bevel etching apparatus 1 can remove a BSP 2 that is adhered to a bevel part of a wafer W by etching the bevel part of the wafer W (by irradiating a laser beam onto the bevel part of the waver W). FIG. 1 shows an example of a situation where the BSP 2 is adhered to the rear side of the bevel part of the wafer W.

The bevel etching apparatus 1 may include a chamber 11 that is a processing container that can accommodate the wafer W. A spin chuck 12 may be installed in the chamber 11. The spin chuck 12 is for rotatably and horizontally holding the wafer W. The spin chuck 12 can be connected to a motor 13 that can be disposed below the chamber 11. The spin chuck 12 can rotate the wafer W while holding the wafer W, for example, by vacuum attraction.

Inside the chamber 11, a BSP removal unit 14 may be installed at a position corresponding to a peripheral part of the wafer W. In a main body 14a of the BSP removal unit 14, a notch part 16 may be provided, so that the peripheral part of the wafer W can pass through while the wafer W is rotated. A laser irradiation head 18 may be provided below the notch part 16. The laser irradiation head 18 can be connected to a laser generator 30. The laser irradiation head 18 can irradiate a laser beam that is emitted from the laser generator 30 onto a bevel part of the wafer 2. The laser irradiation head 18 can be moved in the horizontal direction. Additionally, an angle of the laser irradiation head 18 can be variably adjusted, so that an irradiation position of a laser beam can be adjusted. The laser irradiation head 18 can remove the BSP 2 by irradiating a laser beam onto the peripheral part of the wafer W.

The main body 14a may include an ozone gas discharge nozzle 20 for discharging ozone gas toward the BSP 2; and an ozone gas suction nozzle 19 for suctioning the ozone gas almost 100%. The ozone gas discharge nozzle 20 can be connected to an ozone gas generator 22 through a supply line (pipe) 21 for supplying the ozone gas. The ozone gas that can be output from the ozone gas generator 22 can be introduced inside the chamber 11 from the ozone gas discharge nozzle 20 through the supply line 21. An exhaust pipe 31 can be connected to the ozone gas suction nozzle 19. The exhaust pipe 31 can form an exhaust flow channel for mainly exhausting the ozone gas. The exhaust pipe 31 can be connected to a factory acid exhaust pipe (not shown). An ozone killer 41 for decomposing the ozone gas can be connected to the exhaust pipe 31.

A fan 32 for drawing the air from outside to the chamber 11 and a filter 33 for removing particles of the air that is drawn by the fan 32 may be provided above the chamber 11.

An exhaust port 34 may be provided at a bottom of the chamber 11. The air can be drawn from outside by the fan 32 to the chamber 11 through the filter 33, and the air can be exhausted via the exhaust port 34, so that downflow of cleaning air can be generated inside the chamber 11. An exhaust pipe 35 can be connected to the exhaust port 34, and the exhaust pipe 35 can be connected to the factory acid exhaust pipe (not shown).

A wafer conveyance port 11a can be provided on a side wall of the chamber 11. The wafer conveyance port 11a can be opened and closed by a gate valve 23. The gate valve 23 may include a valve element 24; and an air cylinder 26 for opening and closing the valve element 24. Upon the valve element 24 being closed, the space between the valve element 24 and the chamber 11 can be sealed by a sealing member 25.

A CCD camera 15 can be disposed at a bottom portion of the chamber 11. The CCD camera 15 is for capturing an image of an inner part of the chamber 11 that is illuminated by scattered light of a laser beam that can be emitted by the laser generator 30. In the embodiment, the CCD camera 15 can be disposed at a position at which an image of a peripheral part of the wafer W and an image of a ceiling part of the chamber 11 can be captured.

Figure 2:
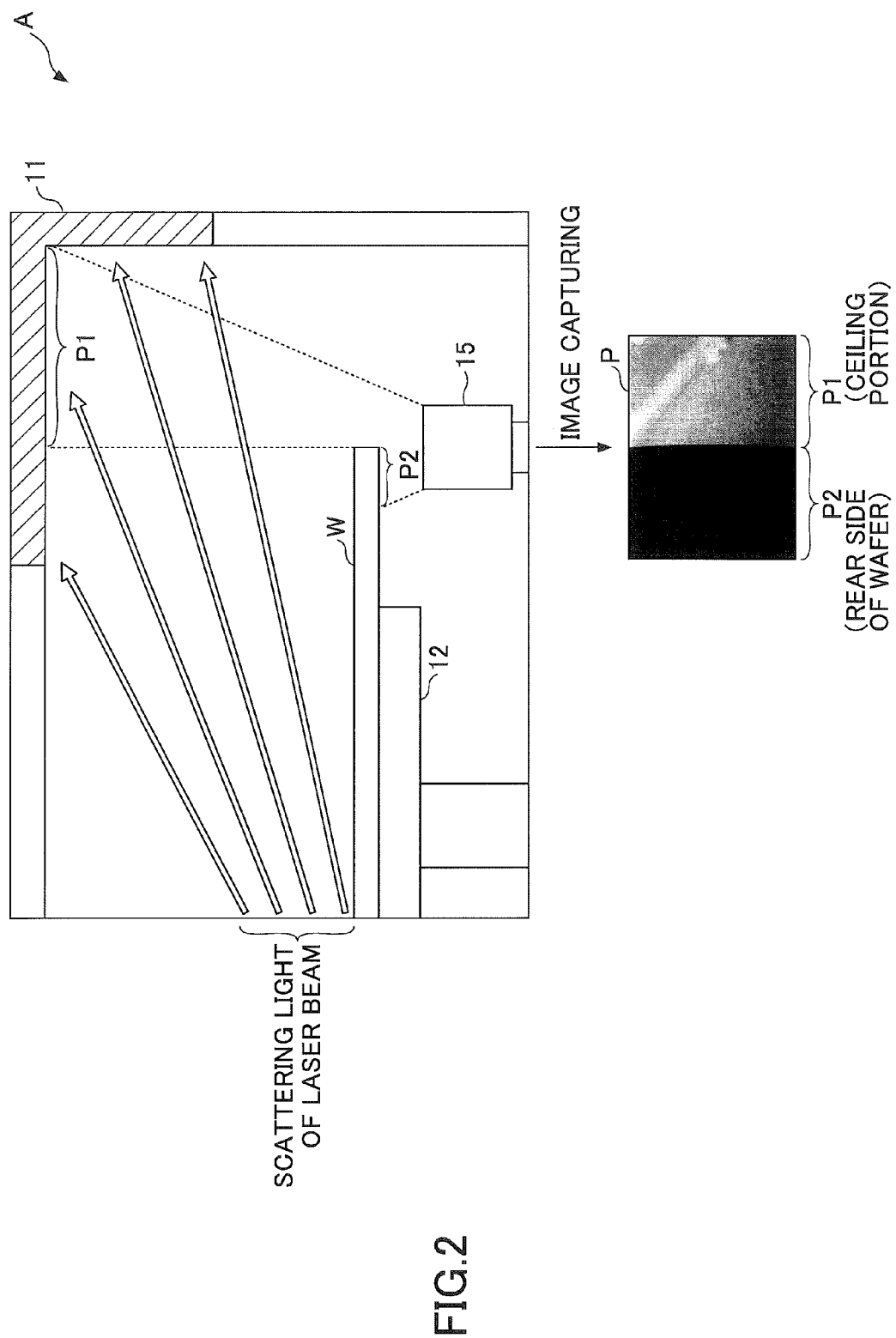
FIG. 2 is a diagram showing an example of a result of image capturing by using scattered light of a laser beam according to the embodiment.

FIG. 2 is an enlarged view enlarging and showing inside the frame A of FIG. 1. During removal of the BSP 2 by irradiating a laser beam onto the peripheral part of the wafer W, the scattered light of the laser beam that is shown in FIG. 2 illuminates the inner part of the chamber 11, so that the inner part of the chamber 11 becomes bright. The CCD camera 15 can capture an image of the ceiling part of the inner part of the chamber 11 that is irradiated by the scattered light of the laser beam. FIG. 2 shows an example of an image P that is obtained as a result of capturing by the CCD camera 15. An image P1 at the right half portion of the image P is the captured image of the ceiling part of the chamber 11. An image P2 at the left half portion of the image P is the captured image of the rear side of the wafer W. In this case, the image of the ceiling part of the chamber 11 is blocked by the wafer W, so that the image of the rear side of the wafer W is captured. The wafer W can be an example of a shield for shielding the scattered light. The image P2 is an example of an image of an area where the scattered light is shielded by a shield inside the chamber 11. The image P1 is an example of an image of an area where a pattern or a shadow inside the chamber 11 is captured.

The CCD camera 15 can be disposed at the bottom portion of the chamber 11. The CCD camera 15 is for capturing an image of an etching condition of the rear side of the wafer W. During the etching process of the bevel part, upon the rear side of the wafer W being irradiated by the laser beam that is output by the laser generator 30, the inner part of the chamber 11 becomes bright because of the scattered light of the laser beam. The CCD camera 15 can capture an image of the ceiling part of the chamber 11 that is illuminated by the scattered light.

Note that the position where the CCD camera 15 is installed is not limited to the bottom portion of the chamber 11. The CCD camera 15 may be disposed at another position of the inner part of the chamber 11. For example, as shown in FIG. 1 by the dashed line, the CCD camera 15 can be disposed at a side surface or a ceiling surface of the chamber 11, while the CCD camera 15 is directed in the horizontal direction or the downward direction, or the CCD camera 15 is tilted by a predetermined angle (e.g., 45 degrees). For example, an image of the inner part of the chamber 11 can be captured by using three CCD cameras 15 that are for alignment of the wafer W and that are evenly spaced while tilted by 45 degrees from the ceiling toward the wafer W. Note that the CCD camera 15 may be an example of an image capturing unit for capturing an image of a predetermined area of the inner part of the chamber 11.

The bevel etching apparatus 1 may include a controller 50. The controller 50 can control the entire bevel etching apparatus 1. The controller 50 can obtain a captured image. The controller 50 can select a predetermined area of the captured image. Here, the predetermined area does not include any shadow, any pattern, nor any shield. The controller 50 can calculate an average value of the brightness of the predetermined area by image processing. Then, the controller 50 can monitor, based on the brightness, an output value (intensity) of the laser beam that is output from the laser generator 30.

The controller 50 may include an image capturing unit 51; a control unit 52; a storage unit 53; and an input/output interface (I/F) 54. The image capturing unit 51 can obtain an image that is captured by the CCD camera 15. The control unit 52 can execute image processing, a laser output monitoring process, and another control process. Specifically, the control unit 52 can select a predetermined area of the inner part of the chamber 11 (the processing container) that is illuminated by scattered light of the laser beam that is emitted by the laser generator 30. The controller 52 can calculate brightness of an image of the selected predetermined area, out of the captured image of the inner part of the chamber 11. The controller 52 can monitor an output value of the laser beam based on the calculated brightness, and data that is measured in advance and that indicates a correlation between an output value of the laser beam output from the laser generator 30 and the brightness.

If the entire captured image is used, a pattern and an obstacle of the ceiling part that are captured in the image can be noise for monitoring the state of the laser beam, so that it can be difficult to monitor an accurate output value of the laser beam. Thus, a portion of the image that does not include noise can be cut out from the captured image, and the obtained image can be used. Note that the process of cutting out the image of the predetermined area from the captured image can be executed by the CCD camera 15 by sending, to the CCD camera 15, coordinate values for identifying the predetermined area, which is selected in advance.

The control unit 52 can be connected to the input/output I/F unit 54, and the control unit 52 can be connected to a keyboard 62, a display 60, and a speaker 61, through the input/output I/F unit 54. An operator can perform operation for inputting a command or the like by using the keyboard 62. The command or the like is for managing the bevel etching apparatus 1. Predetermined information can be displayed on the display 60.

The storage unit 53 may store a control program and/or a recipe for executing predetermined control. Additionally, the storage unit 53 may store a threshold value for determining whether an output value of the monitored laser beam is within a normal range.

Figure 4:
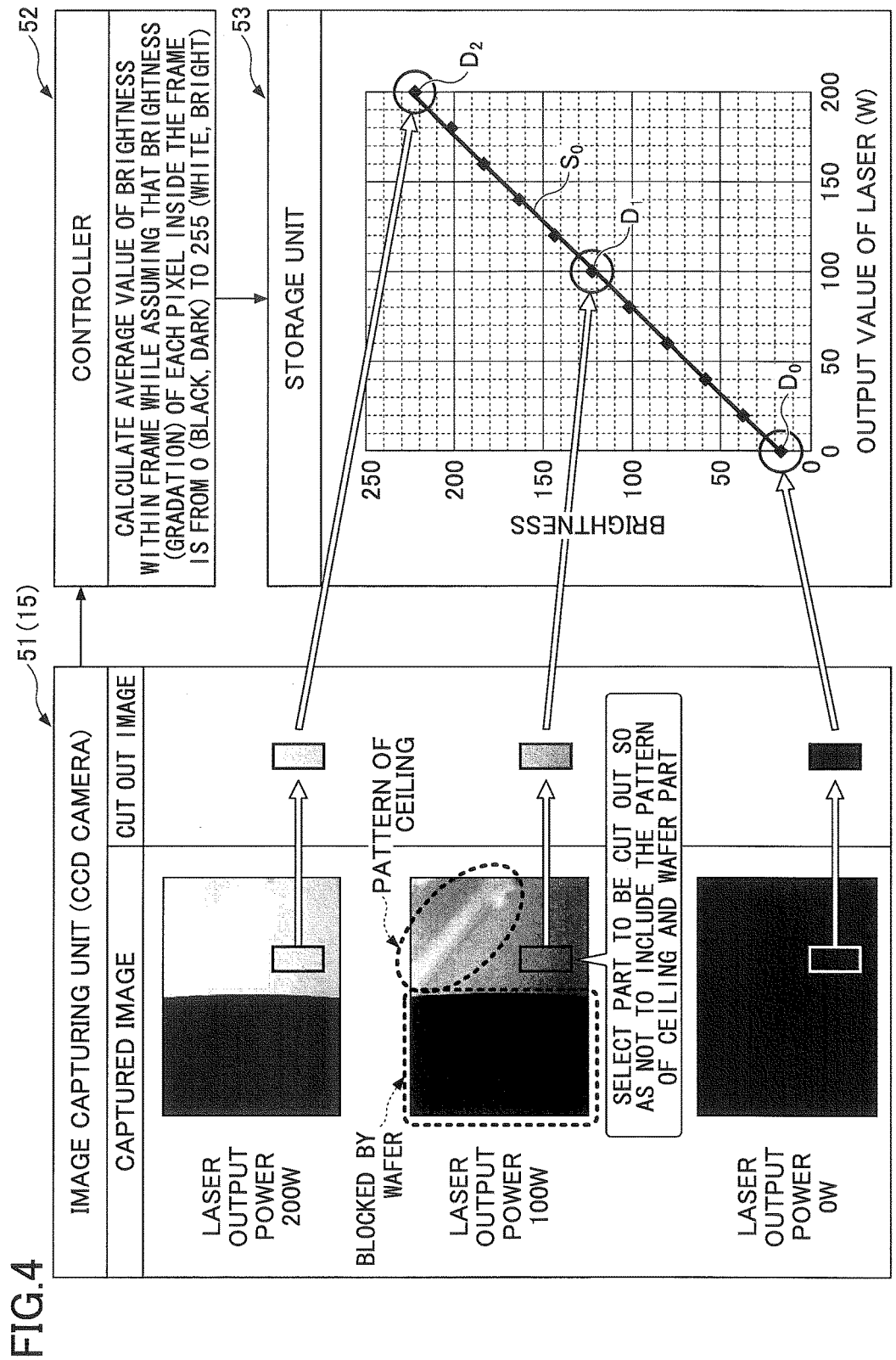
FIG. 4 is a diagram illustrating a function of an image capturing unit, a function of a controller, and a function of a storage unit, according to the embodiment.

Further, as shown in FIG. 4, for example, the storage unit 53 may store a correlation graph $S_0$ that indicates a correlation between an output value of a laser beam and brightness. In response to detecting a command or the like from the input/output I/F unit 54, the control unit 52 can control a process for removing the BSP 2, by invoking a recipe from the storage unit 53 and executing the invoked recipe. Additionally, based on the correlation graph $S_0$ that can be stored in the storage unit 53, the controller 52 can adjust an electric current that is to be supplied to the laser generator 30 depending on an output value of the laser beam that corresponds to the calculated brightness. In this manner, the controller 52 can execute feedback control of the output value of the laser beam.

Upon determining, based on the threshold value that can be stored in the storage unit 53, that the output value of the laser beam that corresponds to the calculated brightness is out of a range of the threshold value, the control unit 52 can execute error processing. At that time, the control unit 52 may execute an automatic correction process for correcting the output value of the laser beam. The automatic correction process is described below. Additionally, the control unit 52 may display a warning message that indicates abnormality in the output value of the laser beam on the display 60 through the input/output I/F unit 54. Additionally, the control unit 52 may cause the speaker 61 to generate warning sound that indicates abnormality in the output value of the laser beam through the input/output I/F unit 54.

The controller 50 may include a microprocessor, a read-only memory (ROM), a random access memory (RAM), and so forth. The function of the control unit 52 may be implemented by the microprocessor. The function of the storage unit 53 may be implemented by the ROM and/or the RAM. The microprocessor can execute a process of removing the BSP 2 by controlling supply of the ozone gas, intensity of the laser beam, and so forth, in accordance with the recipe that can be stored in a storage area, such as the ROM. Additionally, the microprocessor can detect abnormality in the output value of the monitored laser beam, and the microprocessor can adjust the electric current that is to be supplied to the laser generator 30. Note that the function of the control unit 52 may be implemented by using software. Alternatively or additionally, the function of the control unit 52 may be implemented by using hardware.

[Correlation Data Generating Process]

In the embodiment, correlation data that indicates a correlation between the output value of the laser beam that is output from the laser generator 30 and the brightness of the predetermined area of the image of the inner part of the chamber 11 can be generated in advance, and the correlation data can be stored in the storage unit 53, as shown by the example of the correlation graph $S_0$ in FIG. 4. The correlation data can be obtained during etching of the wafer W in the bevel etching apparatus 1, based on an image that can be captured by using the scattered light of the laser beam that is emitted from a new laser generator 30, for example.

The correlation data generating process according to the embodiment is described below by referring to the flowchart of FIG. 3. Upon the process being started, the image capturing unit 51 obtains an image of the inner part of the chamber 11 that is captured by the CCD camera 15 (step S10). Next, the control unit 52 cuts out a predetermined area of the image, which is selected in advance (step S12). The predetermined area is an area other than an area where the scattered light is shielded by a shield inside the chamber 11, an area where a shadow is captured due to the structure inside the chamber 11, and an area where a pattern that is formed inside the chamber 11 is captured. The predetermined area can be automatically selected, or manually selected by an operator. Out of the image (which is shown in FIG. 4) that is captured by the image capturing unit 51 (the CCD camera 15), referring to the image where the output value of the laser beam is 100 W, the left half of the image is an image of the area that is shielded by the wafer W. The area corresponds to an example of the area where the scattered light is shielded by the shield inside the chamber 11. An image of the ceiling part of the chamber 11 is captured in the right half of the image. In the upper portion of the right half of the image, a pattern of the ceiling part is captured. This area corresponds to an example of the area where a pattern that is formed inside the chamber 11 is captured. Thus, any area out of the image area excluding the left half of the image and the area where the pattern of the ceiling part is captured can be selected as the predetermined area. The area that is surrounded by the solid line in FIG. 4 is an example of the predetermined area, which is selected. The image capturing unit 51 cuts out the image of the predetermined area that is selected by image processing. Here, the process of cutting out the image can be executed by the CCD camera 15. In this case, the image capturing unit 51 may obtain the image that is cut.

Figure 3:
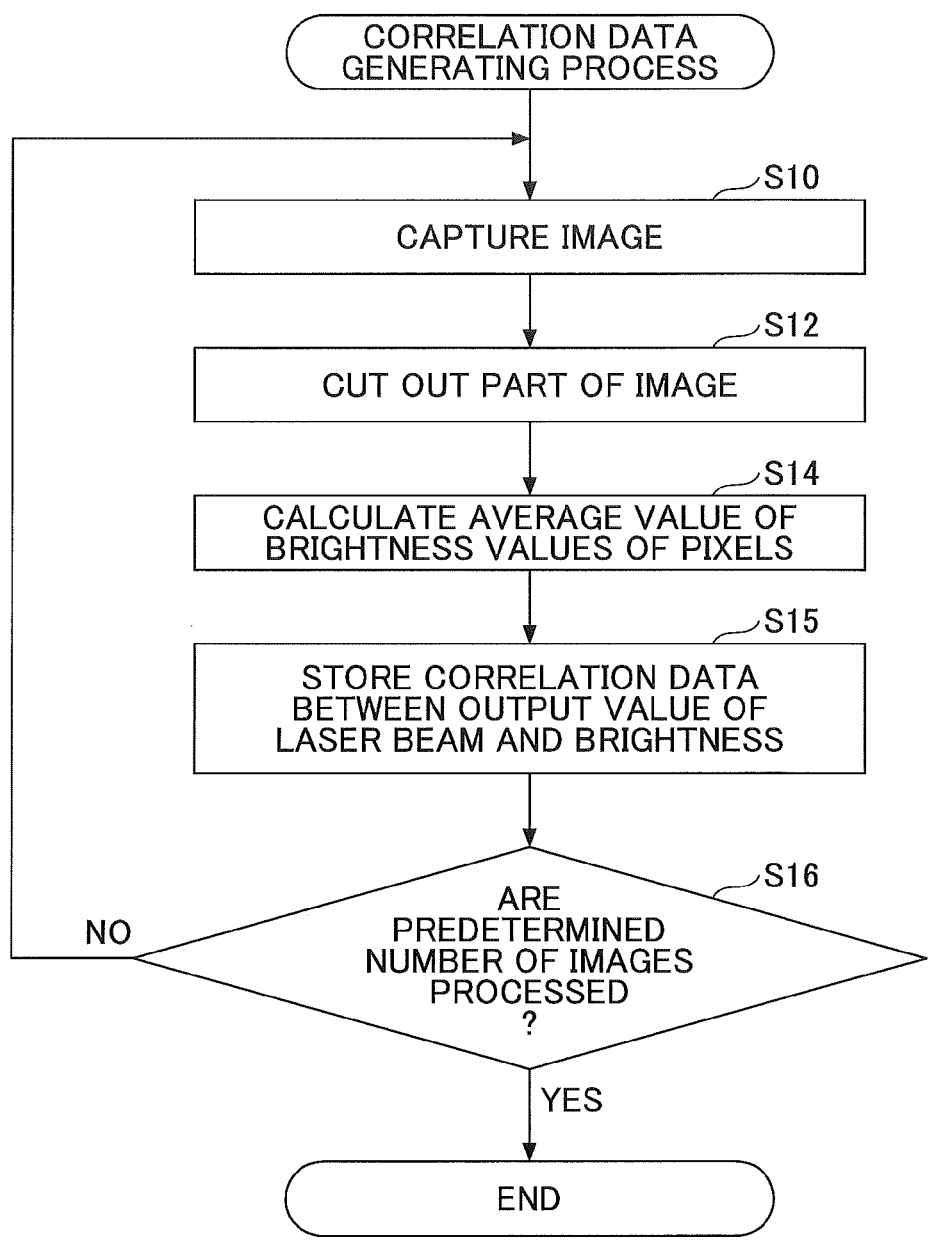
FIG. 3 is a flowchart illustrating an example of a correlation data generating process according to the embodiment.

Referring to FIG. 3, subsequently, the control unit 52 calculates brightness of each pixel of the cut image, and based on the calculated brightness of each pixel, the control unit 52 calculates an average value of the brightness of the image of the predetermined area (step S14). The brightness can indicate gradation of a color by any value from 0 (black, dark) to 255 (white, bright).

Referring to FIG. 4, an average value of the brightness is 122 for the image of the predetermined area that is cut out from the image that is captured when the output value of the laser beam is 100 W. Thus, the storage unit 53 stores the point $D_1$, at which the output value of the laser beam is 100 W and the brightness is 122, as one item of the correlation data (step S15).

Referring to FIG. 3, subsequently, the control unit 52 determines whether a predetermined number of images are processed (step S16). The predetermined number is a number that is greater than or equal to two and that is determined in advance. For example, assuming that the predetermined number is three, the control unit 52 determines that the predetermined number of images are not yet processed because only one image is processed at the present time. Thus, the process returns to step S10, and the second image is obtained. Subsequently, the controller 52 cuts out the predetermined area of the image, which is selected in advance (step S12). For example, if the second image is an image of FIG. 4 that is captured when the output value of the laser beam is 200 W, the controller 52 calculates the brightness of each pixel of the cut image, and the controller 52 calculates an average value of the brightness of the image of the predetermined area based on the calculated brightness for each pixel (step S14). Referring to FIG. 4, an average value of the brightness is 222 for the image that is cut when the output value of the laser beam is 200 W. Thus, the storage unit 53 stores the point $D_2$, at which the output value of the laser beam is 200 W and the brightness is 222, as one item of the correlation data (step S15).

Referring to FIG. 3, subsequently, the control unit 52 determines whether the predetermined number of images are processed (step S16). At the present time at which the two images are processed, the control unit 52 determines that the predetermined number of images are not processed yet. Then, the process returns to step S10, and a third image is obtained. Subsequently, the controller 52 cuts out the predetermined area of the image, which is selected in advance (step S12). For example, if the third image is an image of FIG. 4 that is captured when the output value of the laser beam is 0 W, the controller 52 calculates an average value of the brightness of the cut image (step S14). Referring to FIG. 4, an average value of the brightness is 18 for the image that is cut out from the image that is captured when the output value of the laser beam is 0 W. Thus, the storage unit 53 stores the point $D_0$, at which the output value of the laser beam is 0 W and the brightness is 18, as one item of the correlation data (step S15).

Referring to FIG. 3, subsequently, the control unit 52 determines whether the predetermined number of images are processed (step S16). The control unit 52 determines that the predetermined number of images are processed because three images are processed. Then, the process is terminated.

By the above-described correlation data generating process, data is calculated that indicates a correlation between the output value of the laser beam that is output from the laser generator 30 and the brightness. The correlation graph $S_0$ of FIG. 4 is a line connecting the correlation data $D_0$ to the correlation data $D_2$ of the three points that are calculated by the correlation data generating process. The correlation graph $S_0$ is an example of the correlation data. Note that, in the correlation graph $S_0$ of FIG. 4, items of the correlation data other than $D_0$ to $D_2$ are plotted. However, it suffices if the number of the items of the correlation data is greater than or equal to two.

[Laser Output Monitoring Process]

Figure 5:
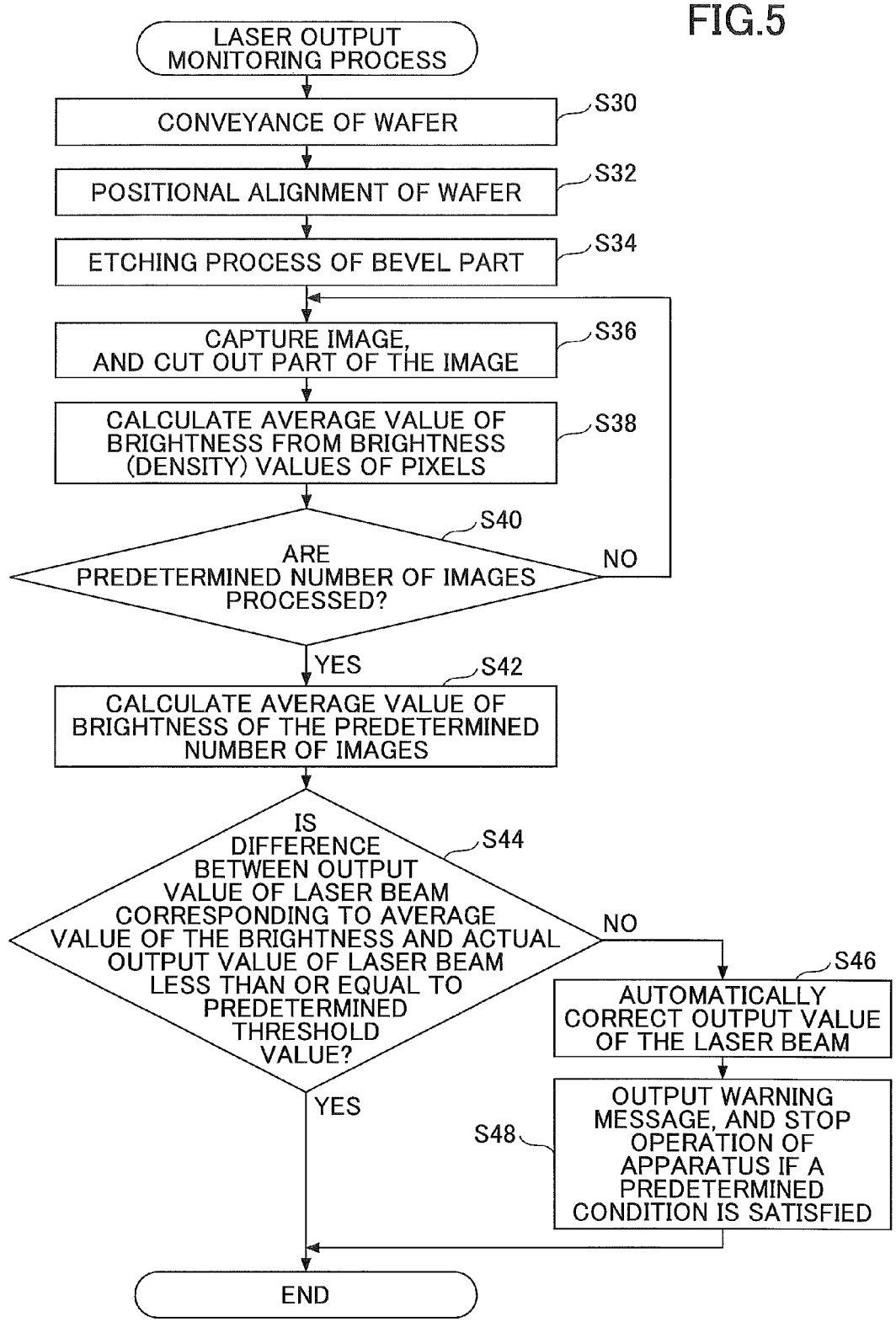
FIG. 5 is a flowchart illustrating an example of a laser output monitoring process according to the embodiment.

Next, a process of monitoring, based on the correlation data (correlation graph) that is stored in the storage unit 53, output of the laser beam with respect to the brightness of the image of the predetermined area that is cut out from the captured image of the inner part of the chamber 11 is described by referring to FIG. 5. In the laser output monitoring process according to the embodiment, the output value of the laser beam that is emitted from the laser generator 30 is monitored during etching of the bevel part of the wafer W by the bevel etching apparatus 1.

In the bevel etching apparatus 1 according to the embodiment, first, the valve element 24 of the gate valve 23 is opened, and a wafer that is to be processed is conveyed inside the chamber 11 through the wafer conveyance port 11a by a conveyance arm (not shown) (step S30). Then, the valve element 24 of the gate valve 23 is closed, and the inner part of the chamber 11 is hermetically sealed. The conveyed wafer W is vacuum attracted by the spin chuck 12 while the wafer W is positioned by the CCD camera 15 that is disposed at the ceiling part (step S32).

Subsequently, a laser beam that is emitted from the laser irradiation head 18 is irradiated onto the bevel part of the wafer W, and an etching process is executed (step S34). During the etching process of the bevel part, the controller 52 adjusts the position of the laser irradiation head 18 so that the laser beam is irradiated onto a peripheral part of the wafer W. Subsequently, by rotating the spin chuck 12 by actuating the motor 13, the wafer W that is held by the spin chuck 12 by attraction is rotated. Then, while rotating the wafer W in this manner, the laser beam is emitted from the laser irradiation head 18 of the BSP removal unit 14 toward the bevel part of the wafer W, and at the same time, ozone gas is sprayed from the ozone gas discharge nozzle 20, and the ozone gas is suctioned by the ozone gas suction nozzle 19. As a result, the BSP 2 is removed by heat that is caused by the laser irradiation and by oxidization by the ozone gas. During the BSP removal process, the ozone gas is supplied from the ozone gas discharge nozzle 20, and the ozone gas is exhausted from the ozone gas suction nozzle 19 through the exhaust pipe 31 as an exhaust flow channel.

During the etching process of the bevel part, the CCD camera 15 captures an image of the ceiling part of the chamber 11 that is illuminated by the scattered light of the laser beam that is emitted from the laser irradiation head 18. The image capturing unit 51 obtains the captured image, and the image capturing unit 51 transmits the captured image to the control unit 52. The control unit 52 cuts out a predetermined area of the captured image, which is selected in advance (step S36).

The control unit 52 applies image processing to the predetermined area that is cut out, and the control unit 52 obtains an average value of brightness of the predetermined area by calculating brightness (density) of each pixel in the predetermined area (step S38). The control unit 52 determines whether a predetermined number of images are processed (step S40). Here, the predetermined number can be a number that is determined in advance and that is greater than or equal to one.

Upon determining, by the control unit 52, that the predetermined number of images are not processed, the process returns to step S36. Then, the next image is obtained, and an average value of the brightness of the predetermined area of the next image is calculated (step S36, S38). Whereas, upon determining that the predetermined number of images are processed, the process proceeds to step S42, and the control unit 52 calculates an average value of the brightness of the predetermined areas of the predetermined number of images, based on the average value of the brightness of the predetermined area of each image.

Subsequently, the control unit 52 identifies an output value of the laser beam with respect to the calculated average value of the brightness, based on the correlation data (e.g., the correlation graph $S_0$ of FIG. 4) that is stored in the storage unit 53. The control unit 52 determines whether a difference between the identified output value of the laser beam and the output value of the laser beam that is actually output from the laser generator 30 is within a range of a predetermined threshold value (step S44). At this time, the range of the predetermined threshold value may be ±10%, for example. Note that the range of the predetermined threshold value is not limited to ±10%. For example, the range of the predetermined threshold value may be ±5%. Further, the range of the predetermined threshold may preferably be varied depending on a type of a film of the wafer W.

For example, for a case in which an output setting value of the laser generator 30 is 100 W, a determination is made that there is no abnormality in the output value of the laser beam from the laser generator 30, if the identified output value of the laser beam with respect to the calculated average value of the brightness is within ±10% of the output setting value of 100 W (i.e., greater than or equal to 90 W and less than or equal to 110 W) In this case, the control unit 52 determines "Yes" at step S44, and the process is terminated.

Whereas, upon determining that the output value of the laser beam that is measured at step S44 is out of the range of ±10% of the output setting value of 100 W, the control unit 52 automatically corrects the output value of the laser beam that is output from the laser generator 30 (step S46).

For example, a determination is made that there is abnormality in the output value of the laser beam from the laser generator 30, if the output value of the laser beam with respect to the calculated average value of the brightness is less than 90 W or greater than 110 W, relative to the output setting value of 100 W. In this case, the control unit 52 determines "No" at step S44, and the process proceeds to step S46.

An example of the automatic correction of the output value of the laser beam at step S46 is described. The control unit 52 uses the correlation graph $S_0$ (the correlation data) for the automatic correction. The example of the correlation graph $S_0$ is shown in FIG. 4. For example, when the output setting value of the laser generator 30 is 100 W, and when the calculated average value of the brightness is "100," the output value of the laser beam corresponding to "100" is 80 W, which is less than 90 W. Thus, the control unit 52 changes the output setting value of the laser generator 30 from 100 W to 120 W. In this manner, control is executed so that the electric current that is to be supplied to the laser generator 30 is increased.

By increasing the intensity of the laser beam that is output from the laser generator 30 in this manner, the brightness can be increased by 20 from the current brightness, based on the correlation graph $S_0$. Namely, after changing the output setting value of the laser generator 30, the average value of the brightness that can be calculated from the captured image is expected to be 120 (=100+20). According to the correlation graph $S_0$, if the brightness is 120, the output value of the laser beam is 100 W. In this manner, the output value of the laser beam can be automatically corrected.

The output value of the laser beam can be varied due to failure or a life span of the laser generator 30, variation in a condensing rate of the laser beam by a lens or a mirror in the laser generator 30, and so forth. In this manner, the output value of the laser beam with respect to the electric current that is supplied to the laser generator 30 can be deviated from the value of the correlation graph $S_0$ that is shown in FIG. 4. However, the control unit 52 automatically corrects, at step S46, the output value of the laser beam based on the correlation graph $S_0$. The automatic correction can be executed by feedback control. In this manner, a laser beam with normal intensity can be irradiated onto the wafer W. It can be prevented that a missing portion occurs in a peripheral part of a wafer W due to a laser beam with abnormal intensity. Consequently a process of removing the BSP 2 can be smoothly executed by the etching process of the bevel part.

Referring to FIG. 5, the control unit 52 displays a warning message on the display 60 through the input/output I/F unit 54 (step S48), and the process is terminated. Further, the control unit 52 may stop the bevel etching apparatus 1, if a predetermined condition is satisfied. The following condition can be an example of the predetermined condition. Namely, the condition is such that a determination is made that a difference between the output value of the laser beam with respect to the calculated average value of the brightness and the output value of the laser beam that is actually output from the laser generator 30 is out of the range that is greater than or equal to $-(10+\alpha)\%$ and less than or equal to $+(10+\alpha)\%$. Here, $\alpha$ is any number that is greater than zero. A missing portion of the wafer W may occur, if the output value of the laser beam with respect to the calculated average value of the brightness is out of the range that is greater than or equal to the output setting value of the laser generator 30 minus 10% and less than or equal to the output setting value of the laser generator 30 plus 10%. Based on the above-described reason, in the embodiment, in response to determining that the output value of the laser beam with respect to the calculated average value of the brightness is out of the range that is greater than or equal to the output setting value of the laser generator 30 minus $(10+\alpha)$ % and less than or equal to the output setting value of the laser generator 30 plus $(10+\alpha)$ %, a determination can be made that there is abnormality in the output value of the laser beam, and the bevel etching apparatus 1 can be temporary stopped. In this manner, a situation can be avoided in which a laser beam with power that is greater than a specified value is irradiated onto a bevel part of a wafer W, and the bevel part of the wafer W is removed, or a missing portion occurs in the bevel part.

As described above, with the bevel etching apparatus 1 according to the embodiment, an output value of a laser beam can be monitored, based on data that indicates a correlation between brightness that is calculated from an image that is captured by using scattered light of a laser beam and an output value of the laser beam that is output from the laser generator 30. In this manner, abnormality in the output value of the laser beam can be detected during processing of the wafer W, and by executing automatic correction of the output value of the laser beam, the wafer W can be prevented from being damaged, and the BSP removal process can be smoothly executed by the etching process of the bevel part.

Additionally, for example, by converting the output value of the laser beam that is shown in the correlation graph $S_0$ in FIG. 4 into a control electric current to be supplied to the laser generator 30, a correlation graph that indicates a correlation between the brightness and an electric current to be supplied to the laser generator 30 may be created and stored in the storage unit 53. In such a case, by using the correlation graph between the brightness and the electric current to be supplied to the laser generator 30, the electric current to be supplied to the laser generator 30 can be controlled based on the average value of the brightness that is obtained from the captured image.

Note that, in response to determining that the output value of the laser beam from the laser generator 30 is abnormal, the control unit 52 can execute at least one of displaying a warning image (step S48) and automatically correcting the output value of the laser beam (step S46).

(Method of Controlling the Electric Current to be Supplied to the Laser Generator)

Figure 6:
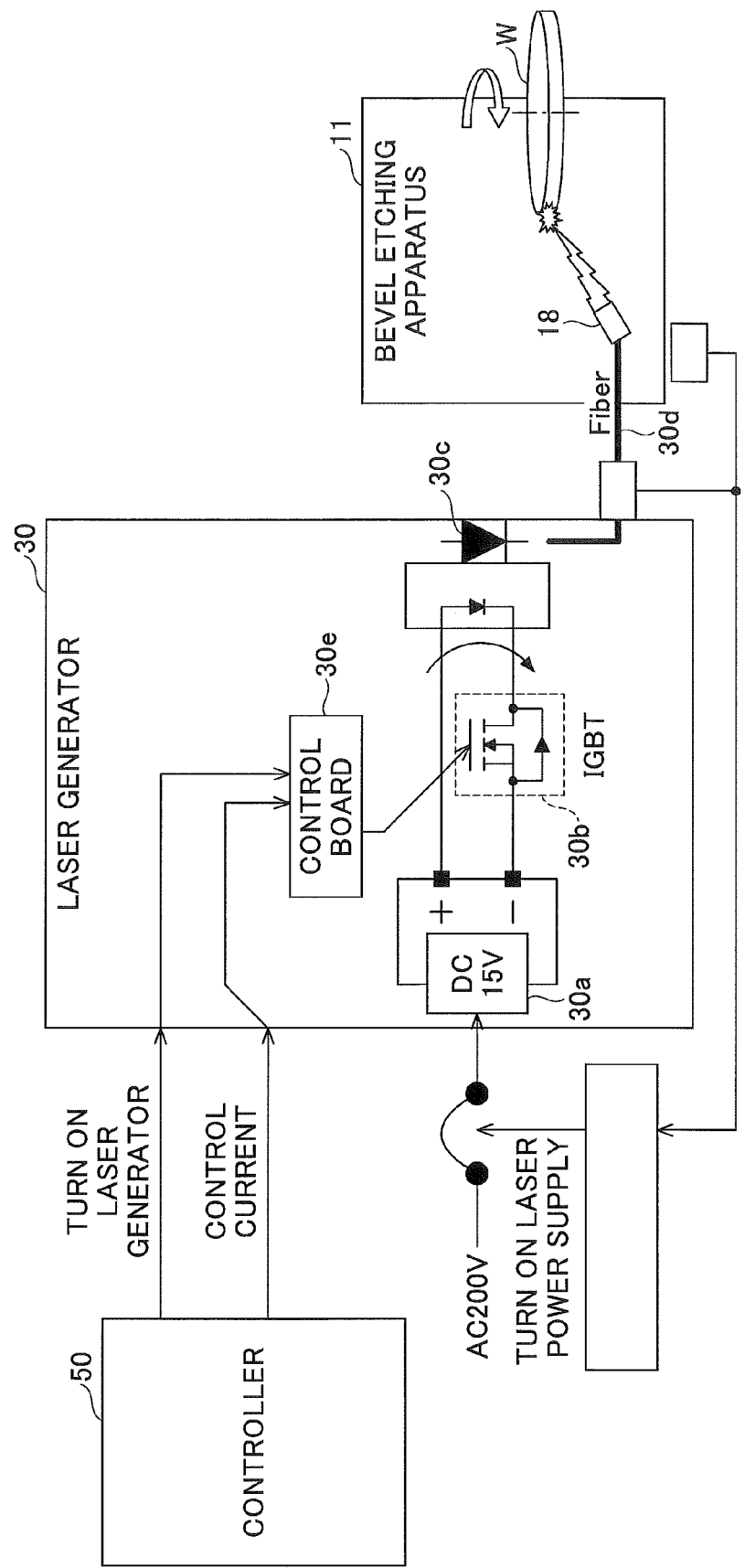
FIG. 6 is a diagram showing an example of a configuration of a laser generator according to the embodiment.

A method of controlling an electric current to be supplied to the laser generator 30 is briefly described by referring to FIG. 6. FIG. 6 shows an example of a configuration of the laser generator 30 according to the embodiment. The laser generator 30 according to the embodiment may include a DC power source 30a; an electric current control element 30b (IGBT); a control board 30e; and an oscillator 30c. An electric current from the DC power source 30a can be supplied to a diode that is provided in the oscillator 30c, and thereby a laser beam can be output. The electric current control element 30b can control an electric current (control electric current) to be supplied from the DC power source 30a to the diode of the oscillator 30c. The laser beam that is output from the laser generator 30 can be transmitted through an optical fiber 30d, and the laser beam is irradiated from the laser irradiation head 18 onto the bevel part of the wafer W.

Based on the output value of the laser beam that corresponds to the brightness that is calculated from the image that is captured by using the scattered light of the laser beam, or based on the control electric current of the laser generator 30, the controller 50 can execute feedback control of the electric current to be supplied to the diode of the oscillator 30c through the control board 30e.

[Modified Example of the Laser Output Monitoring Process]

Figure 7:
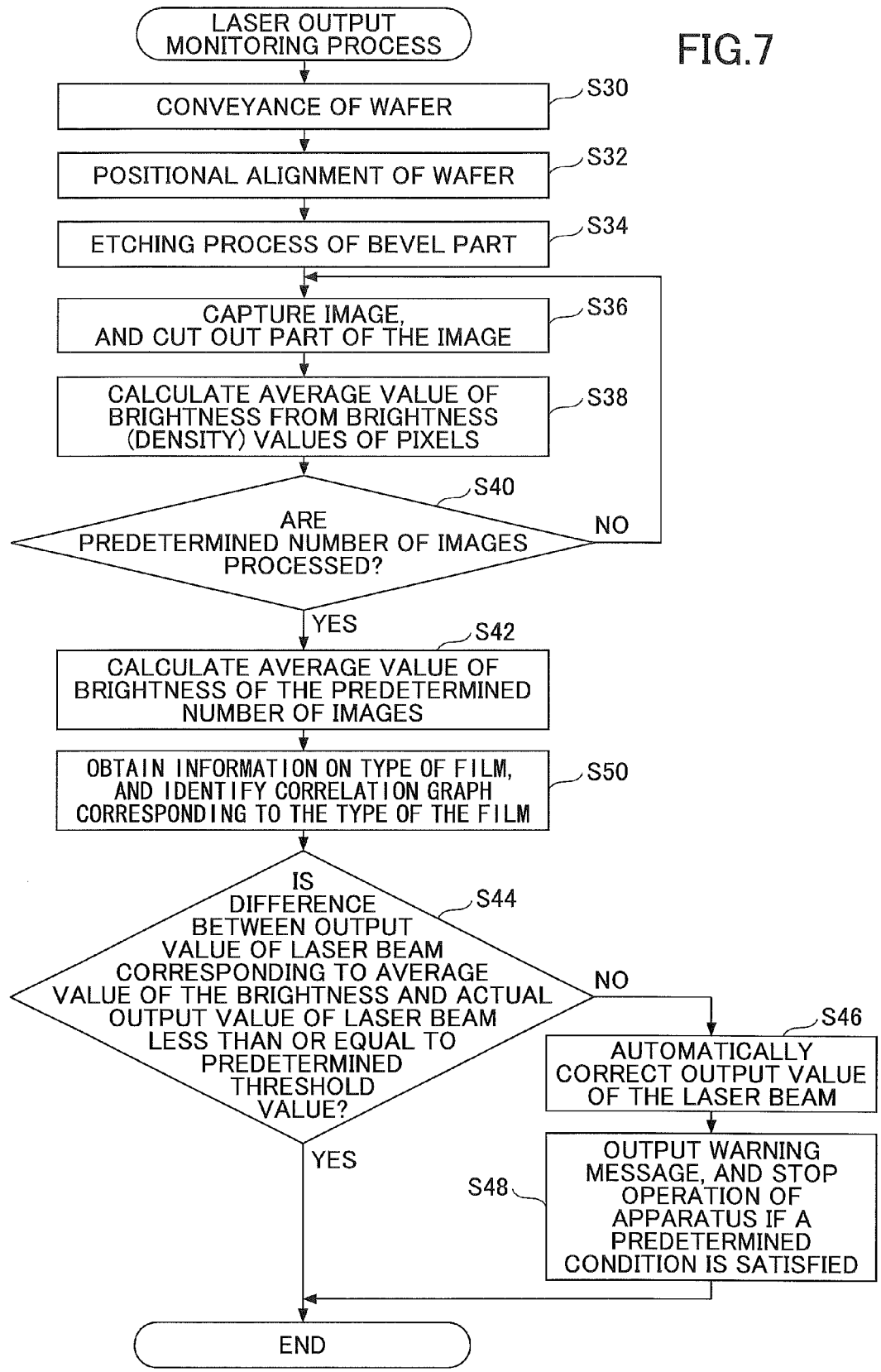
FIG. 7 is a flowchart illustrating an example of the laser output monitoring process according to another embodiment.
Figure 8:
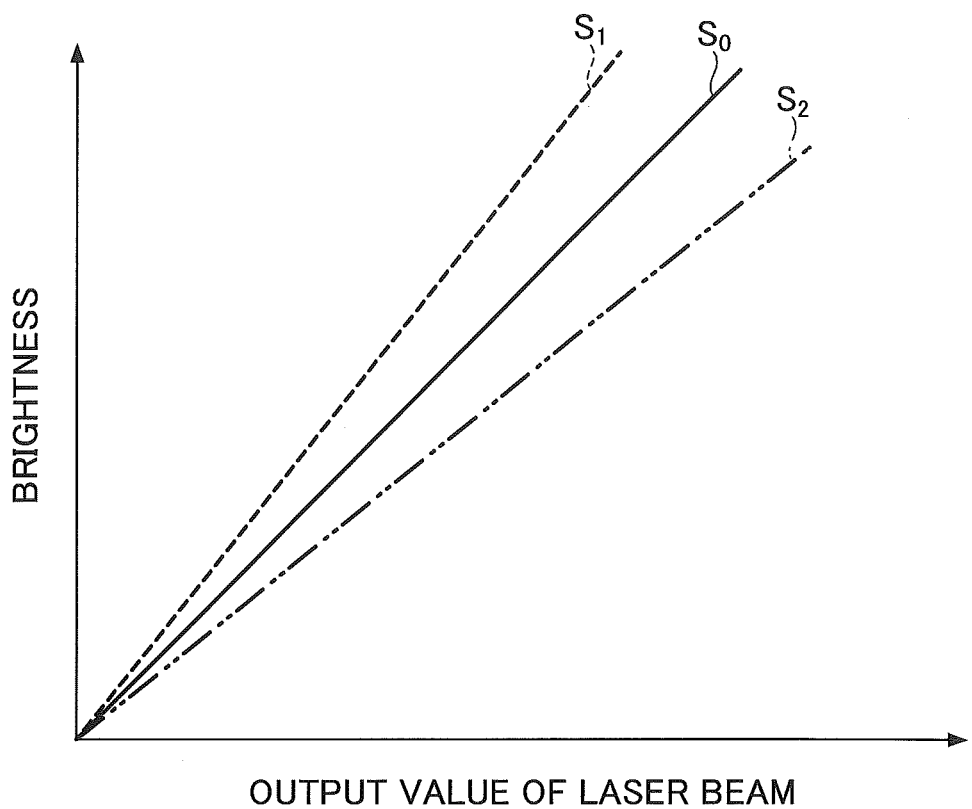
FIG. 8 is a diagram showing an example of a correlation graph for each type of a film according to the other embodiment.

Lastly, a modified example of the laser output monitoring process according to the embodiment is described by referring to FIGS. 7 and 8. It is possible that a state of the scattered light of the laser beam is varied depending on a type of a film that is laminated on the wafer W. Thus, in the modified example, the correlation between the output value of the laser beam that is output from the laser generator 30 and the brightness of the predetermined area of the image of the inner part of the chamber 11 is measured in advance, depending on the type of the film that is formed on the wafer W that is disposed inside the chamber 11. The data indicating the measured correlation for each type of the film may be stored in the storage unit 53. FIG. 8 shows the correlation graph $S_0$ that indicates the correlation between the output value of the laser beam and the brightness for a film type A; a correlation graph $S_1$ that indicates a correlation between the output value of the laser beam and the brightness for a film type B; and a correlation graph $S_2$ that indicates a correlation between the output value of the laser beam and the brightness for a film type C.

As an example of a type of a film that can be formed on the wafer W, a silicon oxide film ($SiO_2$), a silicone nitride film (SiN), and a polysilicon film (Poly-Si) can be considered. Note that the type of the film that can be formed on the wafer W is not limited to these, and any film can be considered.

Next, the process of monitoring the output of the laser beam is described by referring to FIG. 7. In the process, the output of the laser beam is monitored, based on the correlation graph (correlation data) for a plurality of types of films that is stored in the storage unit 53 as described above, by using the brightness of an image of a predetermined area that is cut out from a captured image of the inner part of the chamber 11. The laser output monitoring process according to the modified example is different from the laser output monitoring process according to the embodiment that is shown in FIG. 5 only in a point that a process of step 50 is added.

Namely, after executing the process from step S30 to step S42, the control unit 52 obtains information on a type of a film that is formed on the wafer W, and the control unit 52 identifies a correlation graph corresponding to the type of the film (step S50). The control unit 52 may obtain the information on the type of the film from the recipe that is stored in the storage unit 53.

The control unit 52 may monitor the output value of the laser beam with respect to the calculated brightness, based on the correlation graph that is identified by the type of the film, out of the data that indicates a plurality of correlations between the output value of the laser beam and the brightness that are measured prior to the process of etching the wafer W. Namely, the control unit 52 may identify the output value of the laser beam with respect to the calculated average value of the brightness, based on the specific correlation graph (e.g., one of the correlation graphs $S_0$ to $S_2$ that is identified by the type of the film) that is stored in the storage unit 53. The control unit 52 determines whether the difference between the identified output value of the laser beam and the output value of the laser beam that is actually output from the laser generator 30 is within a predetermined range of a threshold value (step S44).

In response to determining that the difference is within the range of the predetermined threshold value, the control unit 52 terminates the process. Whereas, in response to determining that the difference is out of the range of the predetermined threshold value, the control unit 52 automatically corrects the output value of the laser beam that is output from the laser generator 30 (step S46). Subsequently, the control unit 52 causes the display 60 to display a warning message through the input/output I/F 54 (step S48), and the process is terminated.

In the modified example, taking into consideration that the state of the scattered light of the laser beam may vary depending on the type of the film that is formed on the wafer W, the correlation graph corresponding to the type of the film that is formed on the wafer W can be selected from the correlation graphs that are measured, in advance, for corresponding types of films. Then, based on the selected correlation graph, a determination can be made as to whether the output value of the laser beam corresponding to the brightness of the captured image of the inner part of the chamber 11 is within a predetermined normal range with respect to the output value of the laser beam that is actually output form the laser generator 30.

In the modified example, the correlation graph for each type of the film can be used. Thus, abnormality in the output value of the laser beam can be more accurately detected during processing of the wafer W. Consequently, by executing, for each type of the film, automatic correction or the like of the output value of the laser beam, the wafer W can be more properly prevented from being damaged, and the process of removing the BSP 2 can be more smoothly executed by the etching process of the bevel part.

The etching processing method and the bevel etching apparatus are explained by above-described embodiment and its modified example. By the etching processing method and the bevel etching apparatus according to the above-described embodiment and its modified example, a state of light inside the chamber 11 can be detected by using a captured image of the inner part of the chamber 11 that is illuminated by the scattered light of the laser beam, and thereby the output value of the laser beam can be monitored. According to this method, it may take, at most, one second to stabilize the condition for detecting the light. Thus, there is an advantage such that the time required for the measurement can be short compared to a case of using, for example, a heat sensor to monitor the output value of the laser beam.

The etching processing method and the bevel etching apparatus are explained by above-described embodiment and its modified example. However, the etching processing method and the bevel etching apparatus according to the present invention are not limited to the above-described embodiment and its modified example, and various modifications and improvements may be made within the scope of the present invention. The items that are described in the embodiment and its modified example can be combined (provided that they do not contradict).

For example, in the above-described embodiment and its modified example, the correlation graph that is stored in the storage unit 53 is data indicating the correlation between the output value of the laser beam and the brightness. The correlation is measured prior to the process of etching a substrate, such as the wafer W, in the bevel etching apparatus according to the present invention. However, the correlation graph is not limited to this. For example, the correlation graph that is stored in the storage unit 53 may be data that indicates the correlation between the output value of the laser beam and the brightness. Here, the correlation can be measured prior to the process of etching the substrate in another bevel etching apparatus having a configuration that is the same as that of the bevel etching apparatus according to the above-described embodiment.

Further, the correlation graph may be data that indicates the correlation between the output value of the laser beam and the brightness. Here, the correlation may be measured in the bevel etching apparatus according to the present invention and in a bevel etching apparatus other than the bevel etching apparatus according to the present invention, prior to the process of etching the substrate.

What is claimed is:

1. A method of monitoring output intensity of a laser beam emitted from a laser generator in a bevel etching apparatus for etching a substrate by irradiating the laser beam, the bevel etching apparatus including the laser generator and a controller including an image capturing unit, a memory, and a processor, the method comprising:

capturing, by the image capturing unit, an image of an inner part of a processing container by illuminating the inner part of the processing container by scattered light of the laser beam that is irradiated from the laser generator onto the substrate placed inside the processing container;

calculating, by the processor, brightness of an image of a predetermined area out of the captured image of the inner part of the processing container, the predetermined area being selected in advance; and monitoring, by the processor, based on data indicating a correlation between the output intensity of the laser beam output from the laser generator and the brightness, the data being stored in the memory, the output intensity of the laser beam with respect to the calculated brightness.

2. The method according to claim 1, wherein, as the predetermined area, an area is selected that is obtained by removing, from the captured image, an area where the scattered light of the laser beam is shielded by a shield inside the processing container, an area where a shadow inside the processing container is captured, and an area where a pattern inside the processing container is captured.

3. The method according to claim 1, wherein the monitoring monitors, in the bevel etching apparatus, the output intensity of the laser beam with respect to the calculated brightness, based on the data indicating the correlation between the output intensity of the laser beam and the brightness, the correlation being measured prior to etching the substrate.

4. The method according to claim 1, wherein the monitoring monitors, in another bevel etching apparatus having a configuration that is the same as that of the bevel etching apparatus, the output intensity of the laser beam with respect to the calculated brightness, based on the data indicating the correlation between the output intensity of the laser beam and the brightness, the correlation being measured prior to etching the substrate.

5. The method according to claim 1, wherein the monitoring monitors, in the bevel etching apparatus and in another etching apparatus, the output intensity of the laser beam with respect to the calculated brightness, based on the data indicating the correlation between the output intensity of the laser beam and the brightness, the correlation being measured prior to etching the substrate.

6. The method according to claim 1, further comprising:
determining, by the processor, whether the monitored output intensity of the laser beam is within a range of a predetermined threshold value; and
automatically correcting, by the processor, the output intensity of the laser beam, in response to determining that the output intensity of the laser beam is out of the range of the predetermined threshold value.

7. The method according to claim 1, further comprising:
determining, by the processor, whether the monitored output intensity of the laser beam is within a range of a predetermined threshold value; and
outputting, by the processor, a warning, in response to determining that the output intensity of the laser beam is out of the range of the predetermined threshold value.

8. The method according to claim 1, further comprising:
determining, by the processor, a material of a film that is formed on the substrate,
wherein the monitoring monitors the output intensity of the laser beam with respect to the calculated brightness based on data corresponding to the material of the film, out of data indicating a plurality of correlations between the output intensity of the laser beam and the brightness, the plurality of correlations being measured prior to etching the substrate.

* * * * *